(12) United States Patent
Hirakata et al.

(10) Patent No.: US 7,554,121 B2
(45) Date of Patent: Jun. 30, 2009

(54) ORGANIC SEMICONDUCTOR DEVICE

(75) Inventors: Yoshiharu Hirakata, Kanagawa (JP); Tetsuji Ishitani, Kanagawa (JP); Shuji Fukai, Kanagawa (JP); Ryota Imahayashi, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 451 days.

(21) Appl. No.: 11/011,027

(22) Filed: Dec. 15, 2004

(65) Prior Publication Data

US 2005/0139823 A1 Jun. 30, 2005

(30) Foreign Application Priority Data

Dec. 26, 2003 (JP) ............................. 2003-434646

(51) Int. Cl.
*H01L 27/15* (2006.01)
(52) U.S. Cl. ......................... 257/79; 438/99
(58) Field of Classification Search ............ 257/E51.05, 257/E51.029, E51.042, E51.049, 79, 88; 438/99
See application file for complete search history.

(56) References Cited

U.S. PATENT DOCUMENTS

| | | | |
|---|---|---|---|
| 5,574,291 A | | 11/1996 | Dodabalapur |
| 5,705,826 A | * | 1/1998 | Aratani et al. ............... 257/40 |
| 5,946,551 A | * | 8/1999 | Dimitrakopoulos et al. ... 438/99 |
| 6,013,538 A | | 1/2000 | Burrows et al. |
| 6,150,668 A | | 11/2000 | Bao et al. |
| 6,207,472 B1 | | 3/2001 | Callegari et al. |
| 6,242,758 B1 | | 6/2001 | Yamazaki et al. |
| 6,300,988 B1 | | 10/2001 | Ishihara et al. |
| 6,326,640 B1 | | 12/2001 | Shi et al. |
| 6,335,539 B1 | * | 1/2002 | Dimitrakopoulos et al. ... 257/40 |
| 6,429,053 B1 | | 8/2002 | Yamazaki et al. |
| 6,429,457 B1 | | 8/2002 | Berggren et al. |
| 6,452,207 B1 | | 9/2002 | Bao |
| 6,475,836 B1 | | 11/2002 | Suzawa et al. |
| 6,528,816 B1 | | 3/2003 | Jackson et al. |

(Continued)

FOREIGN PATENT DOCUMENTS

CN 1392615 1/2003

(Continued)

OTHER PUBLICATIONS

Chinese Office Action (Application No. 200410061523.3) dated Jan. 23, 2009 with English Translation.

*Primary Examiner*—Thao P. Le
(74) *Attorney, Agent, or Firm*—Nixon Peabody LLP; Jeffrey L. Costellia

(57) ABSTRACT

It is an object of the present invention to provide a method for manufacturing an inexpensive organic TFT which does not depend on an expensive dedicated device and does not expose an organic semiconductor to atmospheric air. Moreover, it is another object of the present invention to provide a method for manufacturing an organic TFT at low temperature so as not to cause a problem of pyrolyzing a material. In view of the foregoing problems, one feature of the present invention is that a film-like protector which serves as a protective film is provided over an organic semiconductor film. The film-like protector can be formed by being fixed to a film-like support body with an adhesive agent or the like.

37 Claims, 11 Drawing Sheets

U.S. PATENT DOCUMENTS

| | | |
|---|---|---|
| 6,596,569 B1 | 7/2003 | Bao et al. |
| 6,635,508 B2 | 10/2003 | Arai et al. |
| 6,849,877 B2 | 2/2005 | Yamazaki et al. |
| 6,885,146 B2 | 4/2005 | Yamazaki et al. |
| 6,905,908 B2 | 6/2005 | Zhang et al. |
| 7,015,502 B2 | 3/2006 | Arai et al. |
| 7,061,010 B2 | 6/2006 | Minakata |
| 7,211,828 B2 | 5/2007 | Yamazaki et al. |
| 7,378,791 B2 | 5/2008 | Yamazaki et al. |
| 7,420,208 B2 | 9/2008 | Yamazaki et al. |
| 2002/0012080 A1 | 1/2002 | Ishihara et al. |
| 2002/0022299 A1 | 2/2002 | Jackson |
| 2002/0155729 A1* | 10/2002 | Baldwin et al. ............ 438/780 |
| 2002/0164835 A1 | 11/2002 | Dimitrakopoulos et al. |
| 2002/0179901 A1 | 12/2002 | Arai et al. |
| 2005/0140840 A1 | 6/2005 | Hirakata et al. |
| 2005/0176196 A1 | 8/2005 | Zhang et al. |
| 2006/0131573 A1 | 6/2006 | Arai et al. |
| 2006/0208251 A1 | 9/2006 | Yoshizawa |
| 2007/0164295 A1 | 7/2007 | Yamazaki et al. |
| 2008/0303408 A1 | 12/2008 | Yamazaki et al. |

FOREIGN PATENT DOCUMENTS

| | | |
|---|---|---|
| JP | 09-116163 | 5/1997 |
| JP | 2003-338629 | 11/2003 |

* cited by examiner

ORGANIC SEMICONDUCTOR DEVICE

BACKGROUND OF THE INVENTION

1. Field of the Invention

The present invention relates to an organic semiconductor element having an organic semiconductor film and a method for manufacturing thereof. Moreover, the present invention relates to a semiconductor device provided with an organic semiconductor element and a method for manufacturing thereof.

2. Description of the Related Art

In recent years, a display device provided with a thin film transistor (hereinafter, a TFT) having a thin film semiconductor has been studied and put into practical use. A high-resolution display device can be achieved since a large number of pixels can be constituted in the display device provided with a TFT. Moreover, it is known that the display device provided with a TFT can be operated in low power consumption, since it can be operated in low voltage compared with a CRT. Furthermore, the display device provided with a TFT occupies small space, since a display can be constituted without using a large scale of a display tube like a CRT. Thus, such a display device provided with a TFT is widely used for a display portion of a personal computer, a PDA, a TV, or the like. The display device which is made to be thinner, lighter, and more flexible is required in future, and it is more expected to use a resin substrate such as a plastic. However, most of conventional TFTs have been manufactured by using an inorganic semiconductor material such as amorphous silicon or crystalline silicon as a semiconductor film. Therefore, use of a resin substrate and the like such as a plastic is limited since processing temperature of 350° C. or more is needed for forming the semiconductor film in the case where a TFT is manufactured by using an inorganic semiconductor material.

On the other hand, an organic TFT in which an organic semiconductor is used as a semiconductor film has been studied. An organic TFT has high flexibility since an organic material is used. Moreover, as a material for a substrate of an organic TFT, a resin material such as a plastic can be used since an organic TFT can be formed at lower temperature than a device using an inorganic semiconductor. Therefore, a device which is light and flexible can be obtained. Moreover, as for an organic TFT, it is expected that not only process such as a printing method, an ink-jetting method, and a vapor deposition method can be simplified, but the manufacturing cost of a device can be also suppressed since an inexpensive material for a substrate can be used, and thus it is advantageous in view of the cost.

However, an organic semiconductor is oxidized or decomposed due to exposure to water, light, or oxygen. Therefore, an organic semiconductor has a disadvantage that electric properties are deteriorated by being laid in atmospheric air.

SUMMARY OF THE INVENTION

Therefore, the evaluation of electric properties of a device having an organic semiconductor is carried out under vacuum or under anaerobic condition (also referred to as under reduced pressure). To sustain the above vacuum or anaerobic condition, various restrictions for a measuring device and the like are generated since a dedicated device is needed and the evaluation is carried out in a vacuum chamber or a glove box. Moreover, it is expensive to maintain the environment; thus, it is inconvenient in view of practical use. To use a device having an organic semiconductor in atmospheric air, it is essential to protect the organic semiconductor in all devices having an organic semiconductor from being exposed to atmospheric air. Accordingly, it is an object of the present invention to provide a method for manufacturing an inexpensive organic TFT which does not depend on an expensive dedicated device and does not expose an organic semiconductor to atmospheric air. Moreover, it is another object of the present invention to provide a method for manufacturing an organic TFT at low temperature so as not to cause a problem of thermal decomposition of a material.

In view of the foregoing problems, one feature of the present invention is that a film-like protector which serves as a protective film is provided over an organic semiconductor film. As a result, the organic semiconductor film can be protected from water, light, or oxygen.

The film-like protector can be formed by being fixed to a film-like support body with an adhesive agent or the like. The film-like support body has a thickness of from 0.05 to 0.5 mm and preferably has flexibility. The film-like support body preferably has sealing performance, moisture resistance, an insulating property, and chemical resistance. Specifically, polyimide, polyester, polyethylene, polyethylene terephthalate (PET), polyethylene naphthalate (PEN), polyethersulfone (PES), polycarbonate (PC), and the like can be given.

One feature of the present invention is an organic semiconductor device including a semiconductor film having an organic material, a semiconductor element having the semiconductor film, an electric circuit including the semiconductor element, and a film-like protector, wherein the film-like protector is bonded so as to cover the semiconductor film. One feature of the present invention is an organic semiconductor device including a substrate having an insulating surface, a semiconductor film which has an organic material and which is provided over a first substrate, a semiconductor element having the semiconductor film, an electric circuit including the semiconductor element, and a film-like protector, wherein the film-like protector is bonded so as to cover the semiconductor film.

One feature of the present invention is an organic semiconductor device including a substrate having an insulating surface, a semiconductor film having an organic material, a semiconductor element having the semiconductor film, an electric circuit including the semiconductor element, and a group of film-like protectors, wherein the group of the film-like protectors is bonded so as to cover the semiconductor film.

One feature of the present invention is an organic thin film transistor including a first conductive film provided over an insulating surface, an insulating film provided over the first conductive film, a second conductive film provided over the insulating film, an organic semiconductor film provided over the second conductive film, and a film-like protector provided over the organic semiconductor film.

One feature of the present invention is an organic thin film transistor including a first conductive film provided over an insulating surface, an insulating film provided over the first conductive film, an organic semiconductor film provided over the insulating film, a second conductive film provided over the organic semiconductor film, and a film-like protector provided over the organic semiconductor film.

One feature of the present invention is a method for manufacturing an organic semiconductor device including steps of forming a semiconductor film having an organic material, forming a semiconductor element having the semiconductor film, and fixing a film-like protector so as to cover the semiconductor film.

One feature of the present invention is a method for manufacturing an organic semiconductor device including steps of forming a semiconductor film having an organic material over a substrate having an insulating surface, forming a semiconductor element having the semiconductor film, and fixing a film-like protector so as to cover the semiconductor film.

One feature of the present invention is a method for manufacturing an organic semiconductor device including steps of forming a semiconductor film having an organic material over a substrate having an insulating surface, forming a semiconductor element having the semiconductor film, and fixing a group of film-like protectors so as to cover the semiconductor film.

One feature of the present invention is a method for manufacturing an organic thin film transistor including steps of forming a first conductive film, forming an insulating film over the first conductive film, forming a second conductive film over the insulating film, forming an organic semiconductor film over the second conductive film, and fixing a film-like protector so as to cover the organic semiconductor film.

One feature of the present invention is a method for manufacturing an organic thin film transistor including steps of forming a first conductive film, forming an insulating film over the first conductive film, forming an organic semiconductor film over the insulating film, forming a second conductive film over the organic semiconductor film, and fixing a film-like protector so as to cover the organic semiconductor film.

According to the methods for manufacturing the organic semiconductor device and the organic thin film transistor according to the present invention, an organic semiconductor film material is formed by depositing or applying the organic semiconductor film material.

According to the methods for manufacturing the organic semiconductor device and the organic thin film transistor according to the present invention, the first conductive film or the second conductive film can be formed from a conductive paste. Moreover, the first conductive film or the second conductive film can be formed by a screen printing method, a roll coater method, or an ink-jetting method.

According to the methods for manufacturing the organic semiconductor device and the organic thin film transistor according to the present invention, the protector or the group of protectors can be fixed by bonding a film-like support body so as to cover the semiconductor film with an epoxy-based adhesive agent, a urethane-based adhesive agent, an emulsion-based adhesive agent, a synthetic rubber-based adhesive agent, an elastic adhesive agent, or a denatured acrylate-based adhesive agent.

According to the methods for manufacturing the organic semiconductor device and the organic thin film transistor according to the present invention, the protector or the group of protectors can be supplied as a film-like tape roll, a tape which is needed to cover the semiconductor film can be drawn out from the film-like tape roll, and the tape can be directly bonded onto the semiconductor film by a roller in a state that a tension is applied in a direction to be drawn, and the tape can be cut in a predetermined size.

The organic semiconductor film can be protected easily and at low temperature in the organic semiconductor device and the organic thin film transistor described above according to the present invention. Therefore, total cost can be reduced since an expensive and dedicated device is no needed. As a result, a semiconductor device provided with an inexpensive organic TFT can be provided.

According to the above-described present invention, an organic semiconductor can be protected from oxidization or decomposition due to exposure to water, light, and oxygen in atmospheric air.

Moreover, the present invention can be carried out under atmospheric air and normal pressure, since it is necessary to at least cover the organic semiconductor film with a film. Therefore, it is not necessary to heat or pressurize a sample, and thus, a decomposition of the organic material can be prevented. In addition, a plastic material can be used for a substrate since it can be carried out at low temperature, and a protective film can be manufactured without losing an advantage of an organic semiconductor since the film itself is lightweight and flexible.

Moreover, the film may be bonded on the organic semiconductor film under reduced pressure. Accordingly, bubbles generated when bonding a film can be eliminated and adverse effect on the reliability due to mixing of bubbles can be avoided, in addition to an advantage that time of exposure to air and the like can be reduced more.

Furthermore, the present invention does not need huge apparatus, since it is necessary to at least cover the organic semiconductor film with a film. Therefore, total cost can be reduced since a protective film can be formed at a low cost. As a result, a manufacturing cost of a device can set to be low.

These and other objects, features and advantages of the present invention will become more apparent upon reading of the following detailed description along with the accompanied drawings.

DETAILED DESCRIPTION OF THE INVENTION

Hereinafter, embodiment modes according to the present invention will be described in detail with reference to the drawings. However, the present invention can be carried out in many different modes, and it is easily understood by those who are skilled in the art that embodiments and details herein disclosed can be modified in various ways without departing from the purpose and the scope of the present invention. Therefore, it should be noted that the description of embodiment modes to be given below should not be interpreted as being limited to the present invention. Further, in all of views for describing the embodiment mode, the similar portion or the portion which have the similar function is marked with the same reference number, and a repeated explanation thereof will be omitted.

Embodiment Mode 1

Figure 1:
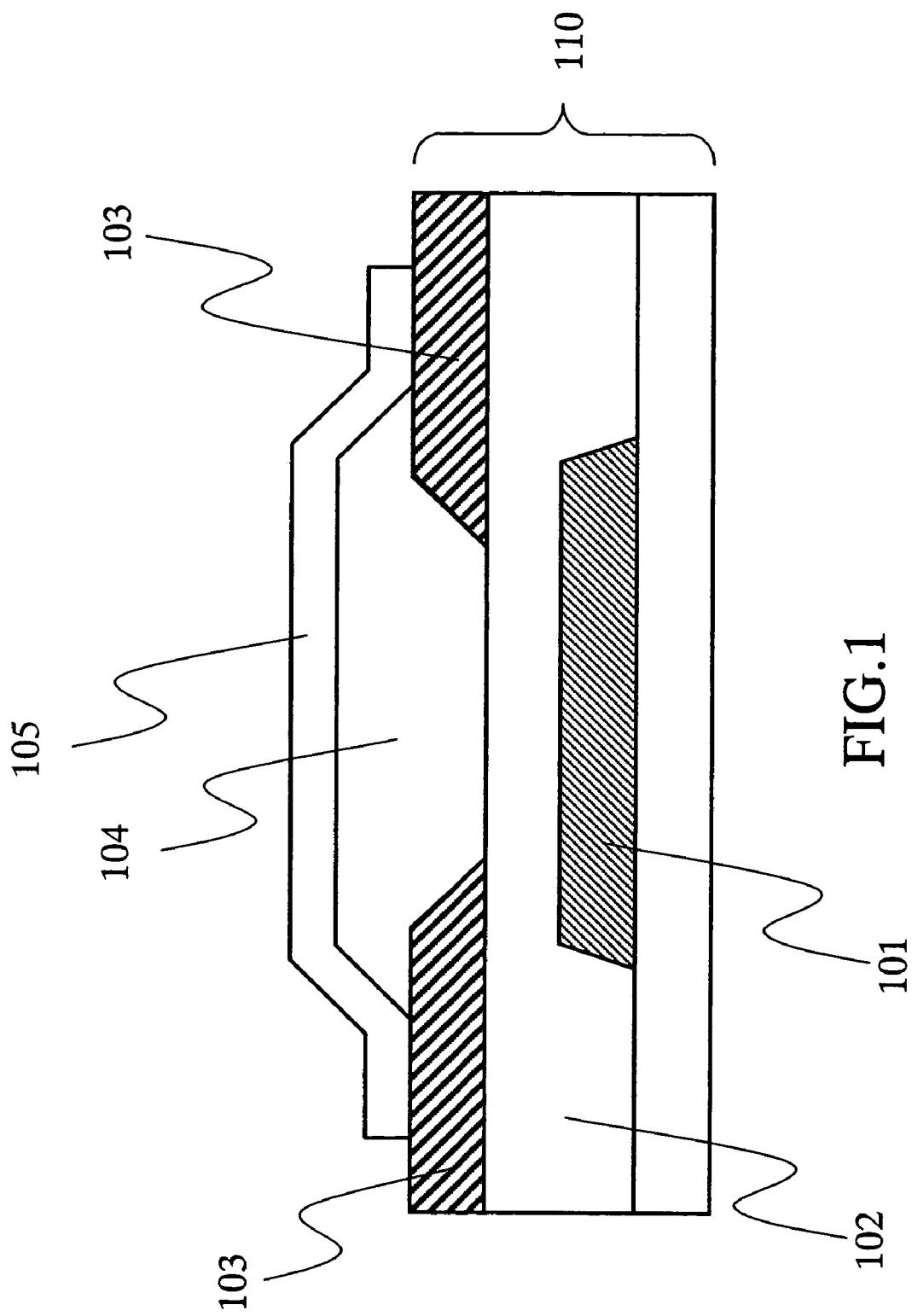
FIG. 1 is a cross-sectional view showing an organic thin film transistor according to the present invention.

In this embodiment mode, a manufacturing method of an organic thin film transistor which is used as a semiconductor element in an organic semiconductor device is described. As shown in FIG. 1, an element substrate 110 provided with a conductive film (hereinafter, referred to as a gate electrode) 101 which serves as a gate electrode and which is formed over an insulating surface of the substrate, an insulating film (hereinafter, referred to as a gate insulating film) 102 that is provided to cover the gate electrode and which serves as a gate insulating film, and a conductive film (hereinafter, referred to as a source electrode and a drain electrode) 103 which is provided via a gate insulating film and which serves as a source electrode and a drain electrode is prepared. Here, the source electrode and the drain electrode are preferably provided to overlap with an edge portion of the gate electrode via the gate insulating film 102.

As the substrate having the insulating surface, a glass substrate such as a barium borosilicate glass and an alumino borosilicate glass or the like, a quartz substrate, a stainless steel substrate, or the like can be used. Moreover, a substrate formed from synthetic resin such as a plastic or an acryl typified by polyethylene terephthalate (PET), polyethylene naphthalate (PEN), polyethersulfone (PES) may be preferably used. A substrate formed from such synthetic resin has flexibility and lightweight.

Moreover, a substrate is preferably used after polishing the surface thereof by a chemical or mechanical polishing method, so called CMP (Chemical-Mechanical Polishing), to enhance the planarity of the substrate. As a polishing agent (slurry) of CMP, a polishing agent in which fumed silica particles obtained by thermally decomposing a chloride silicon gas are dispersed into a KOH solution can be used.

If necessary, a base film may be formed over the substrate. The base film serves as to prevent an alkaline metal such as Na or an alkaline earth metal included in the substrate from dispersing into a semiconductor film; therefore, adverse effect on the characteristic of a semiconductor element is prevented. Therefore, the base film can be formed from an insulating film such as silicon oxide, silicon nitride, silicon oxynitride, titanium oxide, and titanium nitride which can prevent an alkaline metal or an alkaline earth metal from dispersing into the semiconductor film.

Moreover, the conductive film can be formed from a conductive paste or the like by using a screen printing method, a roll coating method, or a droplet discharge method. A droplet discharge method is a method that can form a pattern selectively, and a method for forming a conductive film by selectively discharging (jetting) a droplet (also referred to as a dot) of a composition mixed with a material for a conductive film, an insulating film or the like. A droplet discharge method is also referred to as an ink-jetting method, depending on the system.

In the case where the conductive film is formed by a droplet discharge method, an electric conductor mixed with a solution described hereinafter can be used: gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), or aluminum (Al), an alloy or a dispersion nanoparticle thereof, or a fine particle of silver halide.

Moreover, as the conductive paste, a conductive carbon paste, a conductive silver paste, a conductive copper paste, a conductive nickel, or the like, can be used. After forming the conductive film into a predetermined pattern by the conductive paste, leveling and drying are carried out, and then may be hardened at temperature of from 100 to 200° C.

In addition, the conductive film may be formed by a sputtering method, a spin coating method, a vapor deposition method, or the like. Moreover, the conductive film may be formed from an element selected from the group consisting of Ta, W, Ti, Mo, Al, and Cu; or an alloy material or a compound material in which at least one of the elements is used as a main component.

Furthermore, an insulating film may be formed by a CVD method, a sputtering method, a spin coating method, or a vapor deposition method. As a material for the gate insulating film, an organic compound or the like such as silicon nitride oxide (SiON), silicon oxide film ($SiO_2$), silicon nitride film (SiN), polyvinyl alcohol, siloxane, or polysilazane may be used. Siloxane is a material that has a skeleton formed by a bond of silicon (Si) and oxygen (O), and is formed from a polymer material as a starting material, which includes at least hydrogen as a substituent or includes at least one selected from the group consisting of fluorine, alkyl group, or aromatic hydrocarbon as the substituent. Moreover, polysilazane is formed from a liquid material, which includes a polymer material having a bond of silicon (Si) and nitride (Ni), a so-called polysilazane, as a starting material. As an inorganic material, silicon oxide or silicon nitride can be used.

In addition, an insulating film obtained by anodizing a gate electrode may be used for an insulating film that is used as a gate insulating film.

Next, an organic semiconductor film 104 is formed over the element substrate. As the organic semiconductor material, an organic molecular crystal or an organic high molecular weight compound may be used. As a specific organic molecular crystal, a polycyclic aromatic compound, a conjugated double bond system compound, carotene, a macrocycle compound or a complex thereof, phthalocyanine, a charge transfer type complex (a CT complex), or the like can be given. For example, anthracene, tetracene, pentacene, 6T (hexathiophene), TCNQ (tetracyanoquinodimethane), a TTF (tetrathiafulvalene): TCNQ (tetracyanoquinodimethane) complex, DPPH (diphenylpicrylhydrazyl), pigment, protein, a perylenetetracarboxylic derivative such as PTCDA (3,4,9, 10-perylenetetracarboxylic dianhydride), a naphthalene tetracarboxylic derivative such as NTCDA (1,4,5,8-naphthalenetetracarboxylic dianhydride), or the like can be given. On the other hand, as a specific organic high molecular weight compound, a π-conjugated polymer, a carbon nano tube, polyvinilpyridine, a phthalocyanine metal complex, iodide complex, or the like can be given. Specially, it is preferable to use a π-conjugated polymer having a skeleton constituted by a conjugated double bond such as polyacetyrene, polyaniline, polypyrrole, polythienylene, polythiophene derivatives, poly (3-alkylthiophene), polyparaphenylene derivatives, or polyparaphenylene vinylene derivatives.

Moreover, as a method for forming the organic semiconductor film, a method by which a film having an even film thickness can be formed over the element substrate may be employed. As a specific method, a vapor deposition method, an application method, a spin coating method, a bar-code method, a solution cast method, or a dipping method may be employed. In addition, as pretreatment for forming an organic semiconductor film, plasma treatment may be performed to a surface to be formed, or a film, for example a self-assembled monolayer (SAM) and asnalignment film, may be formed to enhance adhesion or condition of the interface. Heat treatment may be employed after forming the organic semiconductor film. For example, the organic semiconductor film can be heated at temperature of from 100 to 200° C. under atmospheric pressure or under reduced pressure.

Moreover, high frequency may be applied after forming the organic semiconductor film. In addition, heat treatment may be carried out. Note that, in this embodiment mode, pentacene which is an organic material is evaporated by a vacuum vapor deposition method to form the organic semiconductor film 104 over the gate insulating film 102 and the source electrode and the drain electrode 103.

As described above, a semiconductor element having an organic semiconductor film can be formed. Especially, a structure in which the organic semiconductor film is formed over the source electrode and the drain electrode as in Embodiment Mode 1 is referred to as a bottom contact type structure.

Next, a film-like protector 105 covers at least over the organic semiconductor film. The film-like protector can be formed by being fixed to a film-like support body with an adhesive agent or the like.

The film-like support body has a thickness of from 0.05 to 0.5 mm and preferably has flexibility. The film-like support body preferably has sealing performance, moisture resistance, an insulating property, and chemical resistance. Specifically, polyimide, polyester, polyethylene, polyethylene terephthalate (PET), polyethylene naphthalate (PEN), polyethersulfone (PES), polycarbonate (PC), and the like can be given.

Moreover, a film having an inorganic material such as silicon nitride, nitrogen silicon, diamond like carbon (DLC), or aluminium nitride may be formed over at least one of a surface and a rear surface of the film-like support body to enhance sealing performance, moisture resistance, an insulating property, and chemical resistance. Furthermore, a film having an organic material of acryl, polyimide, siloxane, polysilazane, or carbon nitride system and a film having the above-mentioned inorganic material may be laminated with each other.

In addition, an adhesive agent having adhesion, sealing performance, moisture resistance, an insulating property, and chemical resistance is preferably used in the case where the film-like protector is fixed. Specifically, an epoxy-based adhesive agent, a urethane-based adhesive agent, an emulsion-based adhesive agent, a synthetic rubber-based adhesive agent, an elastic adhesive agent, a denatured acrylate based adhesive agent, or the like can be given. Such an adhesive agent may be applied to a part of the film-like support body to bond over at least the organic semiconductor film, or may be applied over at least the organic semiconductor film to be bonded to the film-like support body. Moreover, the film-like support body can be bonded by applying an adhesive agent throughout the semiconductor element. The film-like protector can be formed by a so-called sealing process. Furthermore, heat treatment may be carried out onto the substrate at temperature that is equal to or lower than the melting point of the adhesive agent and the organic semiconductor film after forming the film-like protector.

As a film-like protector having such a film-like support body, specifically, a tape-like protector or a sheet-like protector in which an adhesive agent of silicone polymer is applied to a film formed from polyimide can be used. Such a film-like protector is superior in sealing performance, moisture resistance, an insulating property, and chemical resistance.

At this time, an area which is covered with the film-like protector may be at least over the organic semiconductor film;

however, the area may be enlarged to the gate electrode, the source electrode, and the drain electrode. However, the above electrodes each are provided with a pad to apply voltage or detect current. Therefore, it is necessary to pay attention not to cover the pad completely.

Moreover, the film-like protector may be fixed onto a plurality of the organic semiconductor film. In other words, a group of the film-like protectors may be fixed so as to cover the organic semiconductor film over the element substrate. Specifically, a tape to which an adhesive agent is applied can be bonded to a plurality of the portion in the film-like protector so as to cover a plurality of the organic semiconductor films which are provided over the element substrate.

Furthermore, an insulating film having an organic material or an inorganic material as the film-like protector may be formed. As an organic material used for the insulating film, polyimide, acryl, polyamide, polyimide amide, polyvinyl alcohol, resist, benzocyclobutene, siloxane, or polysilazane can be used. As an inorganic material, silicon oxide or silicon nitride can be used. The insulating film can be formed by a plasma CVD method, a low pressure CVD method, a droplet discharge method, a spin coating method, or a dip method. In the case where the insulating film is formed from a raw material having high viscosity, a droplet discharge method, a spin coating method, or a dip method is preferably used.

Figure 2:
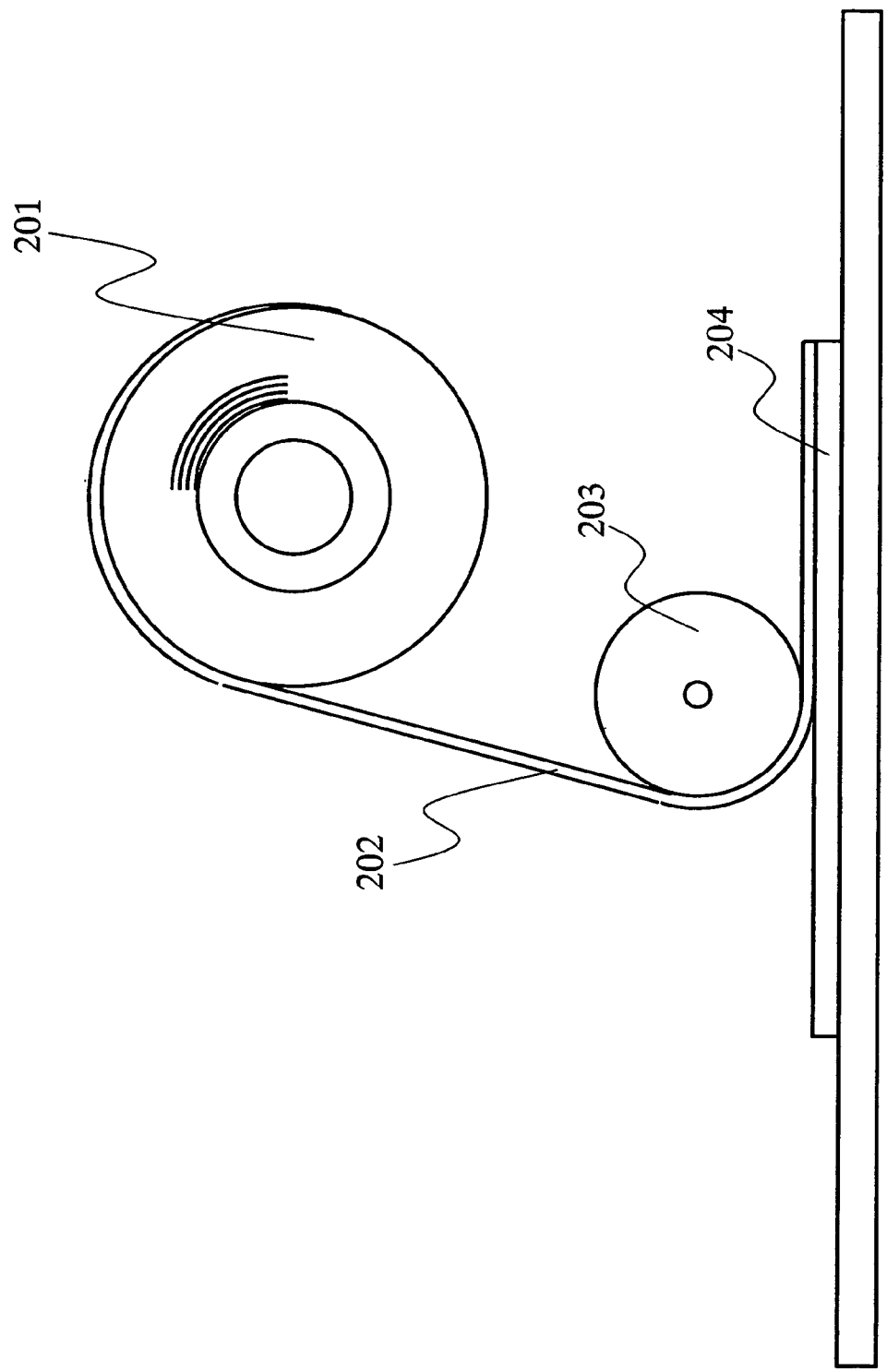
FIG. 2 is a view showing a manufacturing step of a film-like protector according to the present invention.

FIG. 2 shows a method for covering over an organic semiconductor film by a tape to which an adhesive agent is applied and which is used as a film-like protector. A tape 202 is drawn out from a tape roll 201, and an organic semiconductor film 204 is covered with a roller 203 in a state that a tension is applied in a direction of the tape roll and the edge of the tape.

Figure 10:
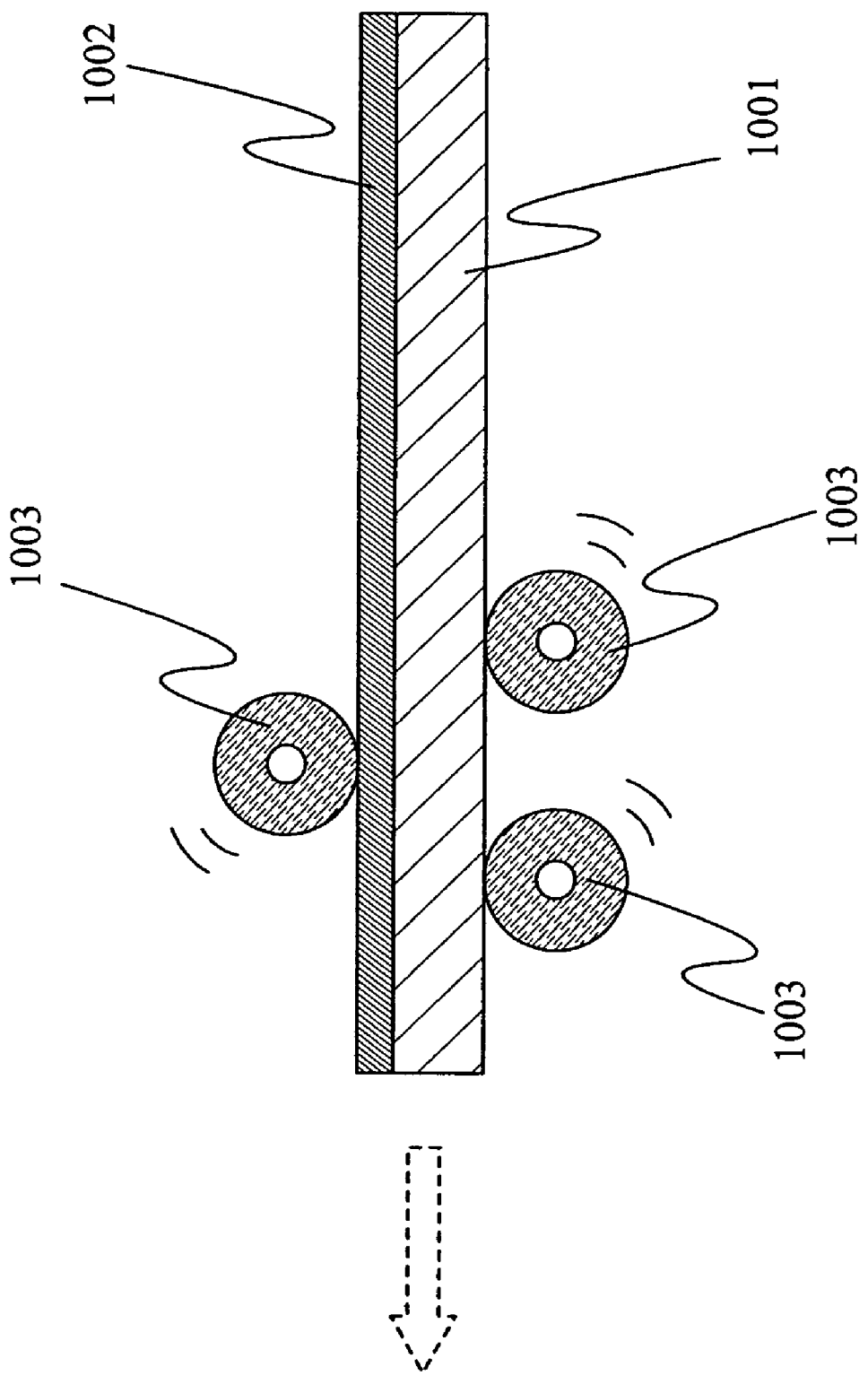
FIG. 10 is a view showing a manufacturing step of a film-like protector according to the present invention.

Moreover, a method for covering over the organic semiconductor film with the film-like protector is not limited to the mode of FIG. 2, and may be carried out by various different modes. FIG. 10 shows a method for forming a protector according to a mode different from that of FIG. 2.

FIG. 10 shows a method for covering over an organic semiconductor film with a sheet 1002 to which an adhesive agent is applied as a film-like protector in a lamination system. A sheet 1002 to which an adhesive agent is applied is put over a substrate 1001. By using a laminate device having a roller 1003 used for bonding, the substrate 1001 and the sheet 1002 are bonded to each other by a roller 1003.

By means of the above-described laminate device, the substrate moves in the direction of an arrow shown in FIG. 10 by rotating the roller 1003. Accordingly, the substrate 1001 and the sheet 1002 can be bonded to each other from end to end with them adhered with each other. Moreover, the roller 1003 has a heat source inside, and the heat source can make the substrate 1001 and the sheet 1002 adhere while heating.

At this time, as for a shape of the sheet 1002 to which an adhesive agent is applied and which serves as the film-like protector, either the shape covering only the organic semiconductor film or the shape covering a whole substrate may be employed.

Moreover, the laminating may be carried out under reduced pressure, which can prevent a bubble from generating when adhering. Furthermore, the sheet may be adhered by the roller while applying a pressure. By applying the pressure, the adhesion between the substrate and the protective film can be further enhanced.

By using the above-mentioned semiconductor element having a bottom contact type structure, a switching element or an electric circuit can be formed. For example, a switching element can be provided for a pixel portion of a liquid crystal device or a display device having a light emitting element (a light emitting device). As an electric circuit, a circuit and the like which controls the switching element can be given. In addition, a liquid crystal display device or a light emitting device having an organic semiconductor element is referred to as an organic semiconductor device.

Embodiment Mode 2

Figure 3:
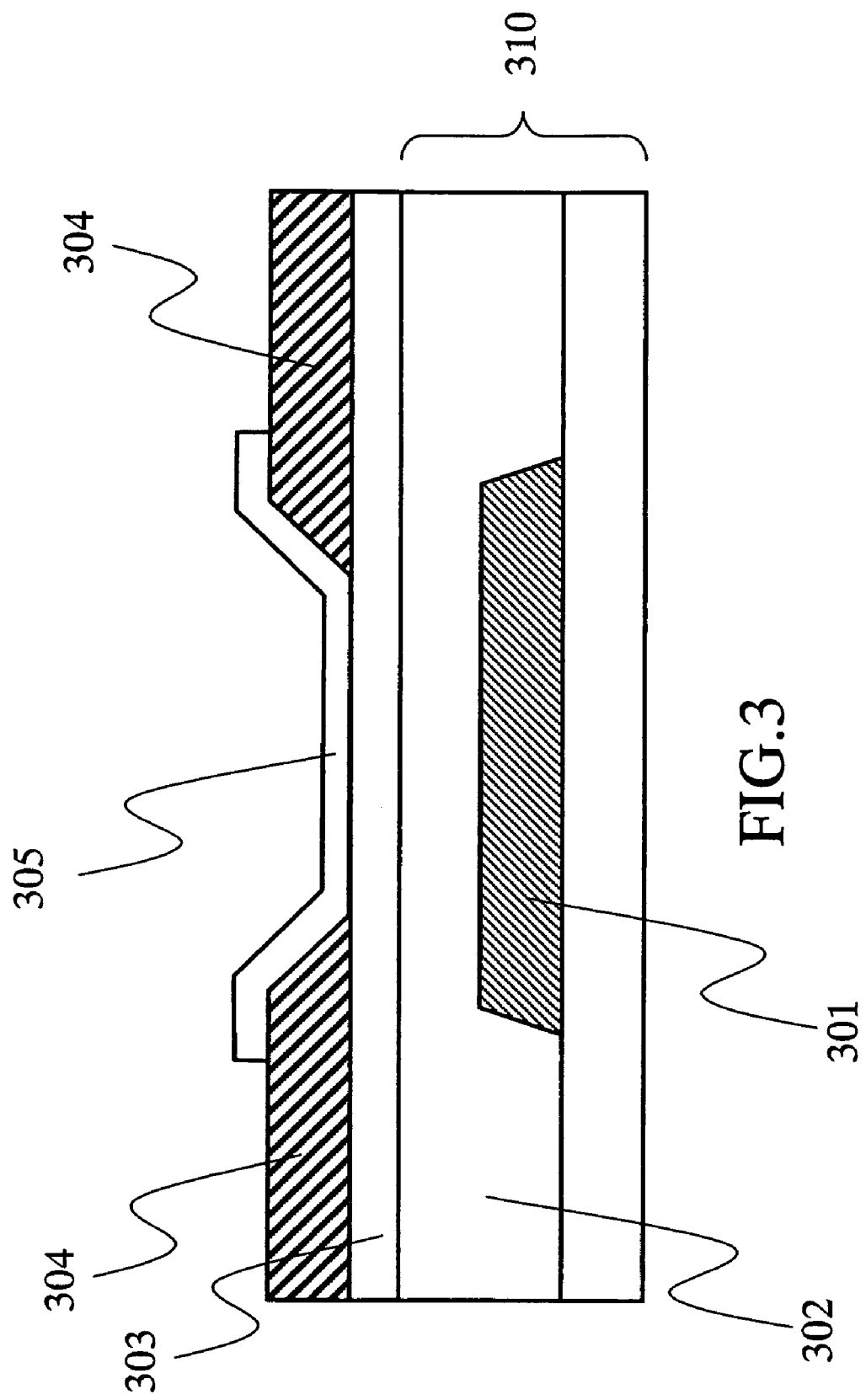
FIG. 3 is a cross-sectional view showing an organic thin film transistor according to the present invention.

In this embodiment mode unlike Embodiment Mode 1, an organic thin film transistor having a top contact type structure in which a source electrode and a drain electrode are formed after forming an organic semiconductor film is illustrated with reference to FIG. 3.

First, as in Embodiment Mode 1, an element substrate 310 provided with a gate electrode 301 formed over an insulating surface and a gate insulating film 302 formed to cover the gate electrode is prepared. A material or a manufacturing method of the gate electrode and the gate insulating film may be referred to Embodiment Mode 1.

Next, an organic semiconductor film 303 is formed over the element substrate. As the organic semiconductor material, an organic molecular crystal or an organic high molecular weight compound may be used. As a specific organic molecular crystal, a polycyclic aromatic compound, a conjugated double bond system compound, carotene, a macrocycle compound or a complex thereof, phthalocyanine, a charge transfer type complex (a CT complex), or the like can be given. For example, anthracene, tetracene, pentacene, 6T (hexathiophene), TCNQ (tetracyanoquinodimethane), a TTF (tetrathiafulvalene): TCNQ (tetracyanoquinodimethane) complex, DPPH (diphenylpicrylhydrazyl), pigment, protein, a perylenetetracarboxylic derivative such as PTCDA (3,4,9,10-perylenetetracarboxylic dianhydride), a naphthalene tetracarboxylic derivative such as NTCDA (1,4,5,8-naphthalenetetracarboxylic dianhydride), or the like can be given. On the other hand, as a specific organic high molecular weight compound, a π-conjugated polymer, a carbon nano tube, polyvinilpyridine, a phthalocyanine metal complex, iodide complex, or the like can be given. Specially, it is preferable to use a π-conjugated polymer having a skeleton constituted by a conjugated double bond such as polyacetyrene, polyaniline, polypyrrole, polythienylene, polythiophene derivatives, poly (3-alkylthiophene), polyparaphenylene derivatives, or polyparaphenylene vinylene derivatives.

Moreover, as a method for forming a film, a method by which a film having an even film thickness can be formed over the element substrate may be employed. As a specific method, a vapor deposition method, an application method, a spin coating method, a bar-code method, a solution cast method, or a dipping method may be employed.

Furthermore, a conductive film 304 that serves as a source electrode and a drain electrode is formed. As a material for the conductive film, in the case where a P-type semiconductor is used for an organic semiconductor, a material having high work function is preferably used to form an ohmic contact with the semiconductor film. On the other hand, in the case where an N-type semiconductor is used for the organic semiconductor, a material having low work function is preferably used. Moreover, as the method for forming a film, a method by which a film having an even film thickness can be formed over the element substrate may be employed. A material or a manufacturing method of the conductive film can be referred to Embodiment Mode 1. Then, the organic semiconductor film is covered with a film-like protector 305. A structure and a manufacturing method of the film-like protector can be referred to Embodiment Mode 1.

By using the semiconductor element having the above-mentioned top contact type structure, a switching element or an electric circuit can be formed. For example, a switching element can be provided for a pixel portion of a liquid crystal device or a display device having a light emitting element (a light emitting device). As an electric circuit, a circuit and the like that controls the switching element can be given. In addition, a liquid crystal display device or a light emitting device having an organic semiconductor element is referred to as an organic semiconductor device.

Embodiment Mode 3

In this embodiment mode, an organic semiconductor device formed by using a transistor of bottom contact type shown in the above Embodiment Mode 1 is described. Note that it is described by using a light emitting device as the organic semiconductor device.

Figure 8:
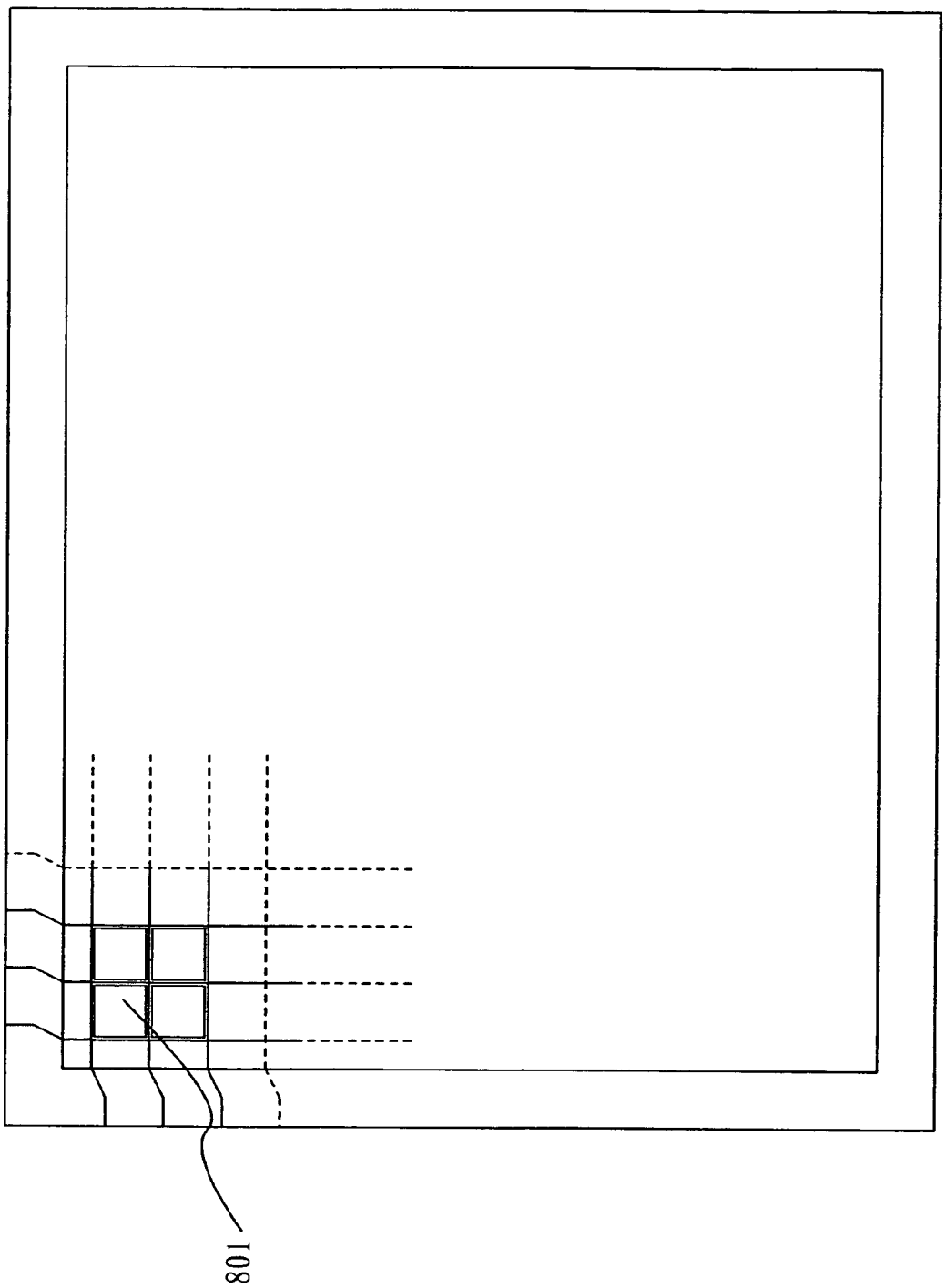
FIG. 8 is an entire view of a panel of a light emitting device according to the present invention.
Figure 9:
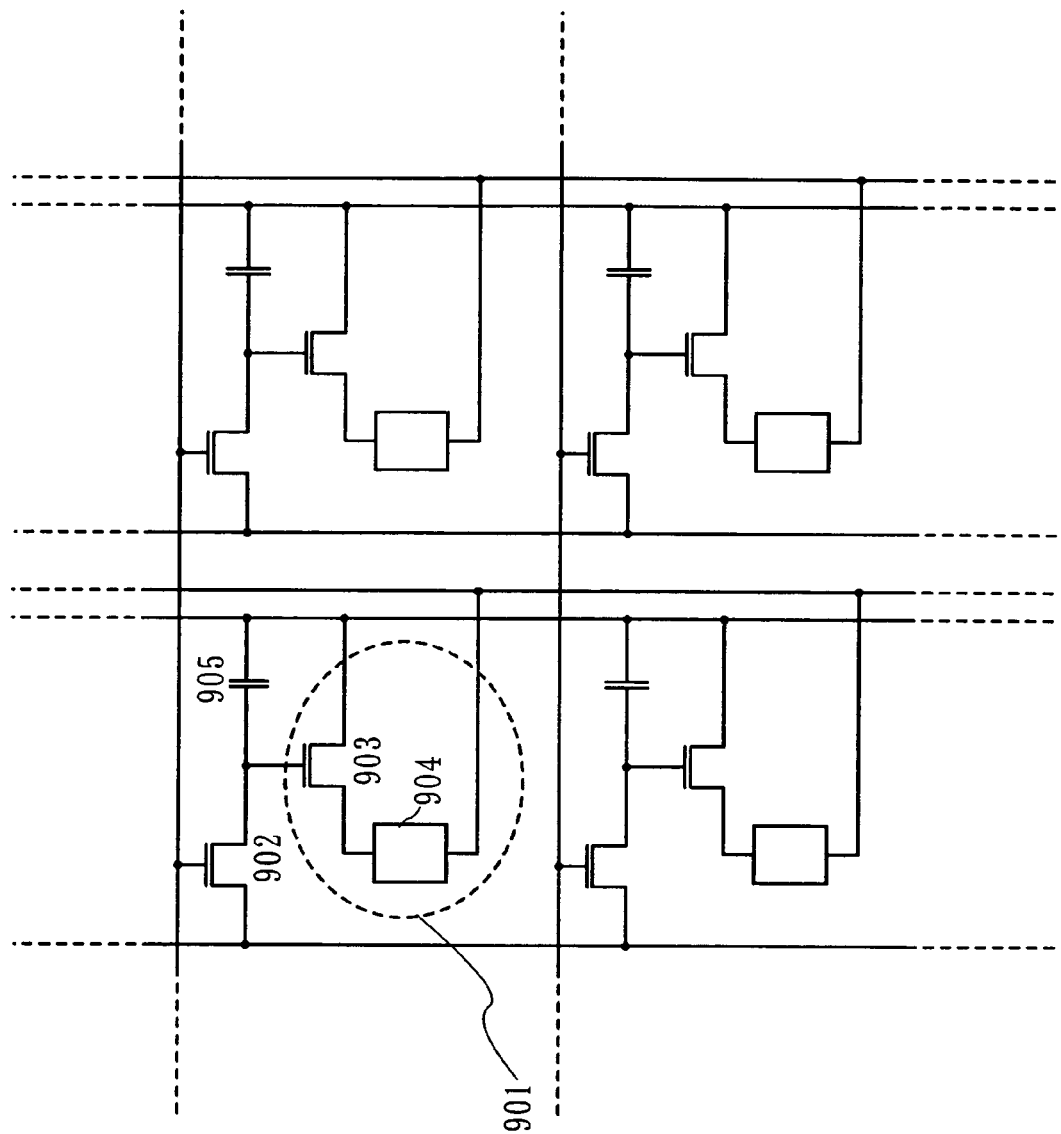
FIG. 9 is an equivalent circuit diagram of a pixel that is included in a light emitting device according to the present invention.

FIG. 8 shows an entire panel in which a light emitting device includes. The panel includes a pixel portion, and in addition, a peripheral driver circuit or a part thereof may be included. The pixel portion includes a plurality of pixel regions 801, and FIG. 9 shows an equivalent circuit diagram of a part of the pixel region. The pixel region includes a switching transistor 902, a driving transistor 903, and a light emitting element 904 connected to the driving transistor. In addition, the pixel region includes a capacitor element 905 for holding voltage between a gate electrode and a source electrode of the driving transistor. The capacitor element does not need to be provided in the case where a gate capacitance of the driving transistor can make up for the capacitor element. Moreover, a mode having two transistors in the pixel region is described in this embodiment mode; however, a mode having three or more transistors may be also employed. For example, an erasing transistor may be also provided to discharge voltage stored with the capacitor element.

A lightning period can be started at the same time as or just after start of a writing period without waiting for signal to write to all pixels by the erasing transistor. Thus, the duty ratio can be enhanced.

Figure 4:
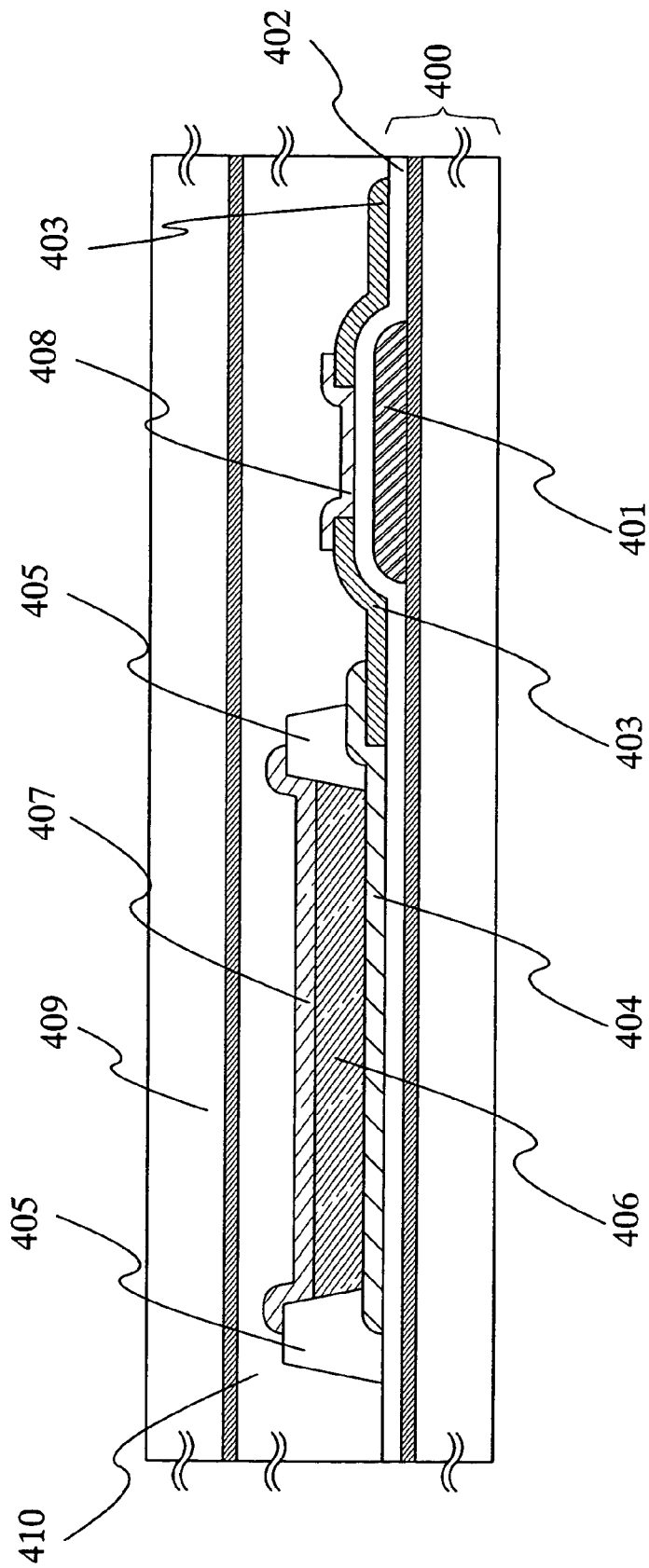
FIG. 4 is a cross-sectional view showing a light emitting device according to the present invention.

Moreover, FIG. 4 shows a cross-sectional view of a dotted line region 901, in other words, the driving transistor and the light emitting element.

First, an element substrate 400 provided with a base layer 411 over an insulating surface of the substrate, a gate electrode 401, a gate insulating film 402 provided to cover the gate electrode and a source electrode and a drain electrode 403 provided via the gate insulating film is prepared. A material or a manufacturing method of the gate electrode, the gate insulating film, and the source electrode and the drain electrode may be referred to Embodiment Mode 1. A pixel electrode 404 is provided to be electrically connected to the above-mentioned drain electrode 403. In this embodiment mode, the pixel electrode is light-transmitting, since a light emitting element is used as a display element and light emitted from the light emitting element is extracted from the pixel electrode side. For example, the pixel electrode can be formed by using ITO (indium tin oxide), IZO (indium zinc oxide) in which 2 to 20% zinc oxide (ZnO) is mixed into indium oxide, or ITO-SiO$_x$ (expediently, referred to as ITSO or NITO) in which 2 to 20% silicon oxide (SiO$_2$) is mixed into indium oxide.

Next, an insulator (an insulating layer) 405 (referred to as a bank, a partition wall, a barrier, an embankment, or the like) which covers an edge portion of the pixel electrode 404 is formed. As the insulator 405, an organic material having photosensitivity (acryl, polyimide, or the like), siloxane, or the like may be used.

Then, an electroluminescent layer 406 is provided to cover the pixel electrode 404, and a common electrode 407 is formed over the electroluminescent layer 406. The common electrode can be formed from a light-transmitting or non light-transmitting electrode material. In the case of light-transmitting, a top emission type light emitting device in which light emitted from the electroluminescent layer is emitted toward a common electrode portion side or a dual emission type light emitting device in which light emitted from the electroluminescent layer is emitted additionally toward a common electrode portion side and toward a pixel portion side can be formed.

As a material for the electroluminescent layer, an organic material (including a low molecular weight material or a high molecular weight material) or a composite material of an organic material and an inorganic material can be used. In addition, the electroluminescent layer can be formed by a droplet discharge method, an application method, or a vapor deposition method. A droplet discharge method or an application method is preferably used for a high molecular weight material, and a vapor deposition method, especially a vacuum vapor deposition method is preferably used for a low molecular weight material. In this embodiment mode, the low molecular weight material is formed as the electroluminescent layer by using a vacuum vapor deposition method.

Note that there can be a singlet excited state or a triplet excited state as a kind of a molecular exciton formed from the electroluminescent layer. A ground state is normally a singlet excited state, and light emission from a singlet excited state is referred to as fluorescence. Moreover, light emission from a triplet excited state is referred to as phosphorescence. Light emission from the electroluminescent layer sometimes includes both fluorescence and phosphorescence. Furthermore, fluorescence may be used in combination with phosphorescence, and either of them can be selected depending on luminescence property (such as emission luminance or the lifetime) of each RGB.

In detail, the electroluminescent layer is sequencially laminated by a HIL (hole injecting layer), a HTL (hole transporting layer), an EML (emitting layer), an ETL (electron transporting layer), an EIL (electron injecting layer) from the side of the pixel electrode 404. Note that the electroluminescent layer can employ a single layer structure or a mixed structure, in addition to a laminated structure.

Specifically, CuPc or PEDOT as the HIL, α-NPD as the HTL, BCP or Alq$_3$ as the ETL and BCP: Li or CaF$_2$ as the EIL are each used respectively. Alq$_3$ doped with a dopant corresponding to each luminescent color of RGB (DCM or the like for R, DMQD or the like for G) may be used as the EML, for example.

Note that the electroluminescent layer is not limited to the above material. For example, hole injectability can be enhanced by co-evaporating oxide such as molybdenum oxide (MoOx: x=2 to 3) and α-NPD or rubrene instead of using CuPc or PEDOT. Moreover, benzoxazole derivatives (referred to as BzOS) may be used for the electron injecting layer.

Therefore, an organic semiconductor film 408 is formed over the element substrate. As the organic semiconductor material, an organic molecular crystal or an organic high molecular weight compound may be used. As a specific organic molecular crystal, a polycyclic aromatic compound, a conjugated double bond system compound, carotene, a macrocycle compound or a complex thereof, phthalocyanine, a charge transfer type complex (a CT complex), or the like can be given. For example, anthracene, tetracene, pentacene, 6T (hexathiophene), TCNQ (tetracyanoquinodimethane), a TTF (tetrathiafulvalene):TCNQ (tetracyanoquinodimethane) complex, DPPH (diphenylpicrylhydrazyl), pigment, protein, a perylenetetracarboxylic derivative such as PTCDA (3,4,9,10-perylenetetracarboxylic dianhydride), a naphthalene tetracarboxylic derivative such as NTCDA (1,4,5,8-naphthalenetetracarboxylic dianhydride), or the like can be given. On the other hand, as a specific organic high molecular weight compound, a π-conjugated polymer, a carbon nano tube, polyvinilpyridine, a phthalocyanine metal complex, iodide complex, or the like can be given. Specially, it is preferable to use a π-conjugated polymer having a skeleton constituted by a conjugated double bond such as polyacetyrene, polyaniline, polypyrrole, polythienylene, polythiophene derivatives, poly (3-alkylthiophene), polyparaphenylene derivatives, or polyparaphenylene vinylene derivatives.

Moreover, as a method for forming a film, a method by which a film having an even film thickness can be formed over an element substrate may be employed. As a specific method, a vapor deposition method, an application method, a spin coating method, a bar-code method, a solution cast method, or a dipping method may be employed.

Here, the electroluminescent layer, the common electrode, and the organic semiconductor film can be formed by using each metal mask in the case where the electroluminescent layer, the common electrode, and the organic semiconductor film are formed by a vapor deposition method. Therefore, any one of the electroluminescent layer, the common electrode, or the organic semiconductor film may be formed first.

Next, the organic semiconductor film is covered at least with a film-like protector constituted by a film-like support body 409 and an adhesive agent 410. The film-like protector is provided to at least cover over the organic semiconductor film and whatever way is employed as long as the film-like protector is provided in the range that does not influence light emission. For example, the film-like protector may be provided so as to cover the entire surface of a pixel region, or may be provided so as to cover throughout a pixel portion. A structure or a means for manufacturing the film-like protector can be referred to Embodiment Mode 1.

Generally, a light emitting element formed from an electroluminescent layer includes a step of approximately from 0.5 to 2 μm. However, the film-like support body 409 has a thickness ranging from 50 to 500 μm, and the adhesive agent 410 has a thickness ranging from 2 to 100 μm. Since a thickness of the film-like support body 409 and the adhesive agent 410 are higher than the step of the light emitting element and the adhesive agent serves as a cushioning material, the film-like protector can evenly cover the entire surface of the pixel portion.

The total area in which the adhesive agent is exposed in the edge portion of the substrate is preferably small in terms of moisture resistance, so the adhesive agent having thinner thickness is advantageous. Therefore, it is necessary to consider a step of the light emitting element and buffering performance in the case where the thickness of the adhesive agent is estimated. Here, an adhesive agent of 20 μm thick is used. A light emitting device can be formed from the semiconductor element described above. Especially, a bottom emission type light emitting device in which light is emitted from a pixel portion side can be formed.

Embodiment 1

In this embodiment, Vg-Id characteristic of an organic TFT in which on organic semiconductor film was protected by using the protection method according to the present invention was measured. In this embodiment, a film-like protector was formed over the organic semiconductor film by a method for covering the organic semiconductor film with a tape in which an adhesive agent was applied, according to Embodiment Mode 1. Note that as shown FIG. 2 an organic TFT used as a test sample has a structure in which a gate electrode 501 formed from tungsten is provided over a quartz substrate, a gate insulating film is provided over the gate electrode, a source electrode 502 and a drain electrode 503 formed from tungsten are provided over the gate insulating film, and an organic semiconductor film is provided between the source electrode 502 and the drain electrode 503, in atmospheric air. Moreover, the source electrode 502, the drain electrode 503, and the gate electrode 501 each is provided with a measuring pad (a pad 504 for the source electrode, a pad 505 for the drain electrode, a pad 506 for the gate electrode) to apply the measured voltage or to detect the current.

Figure 5:
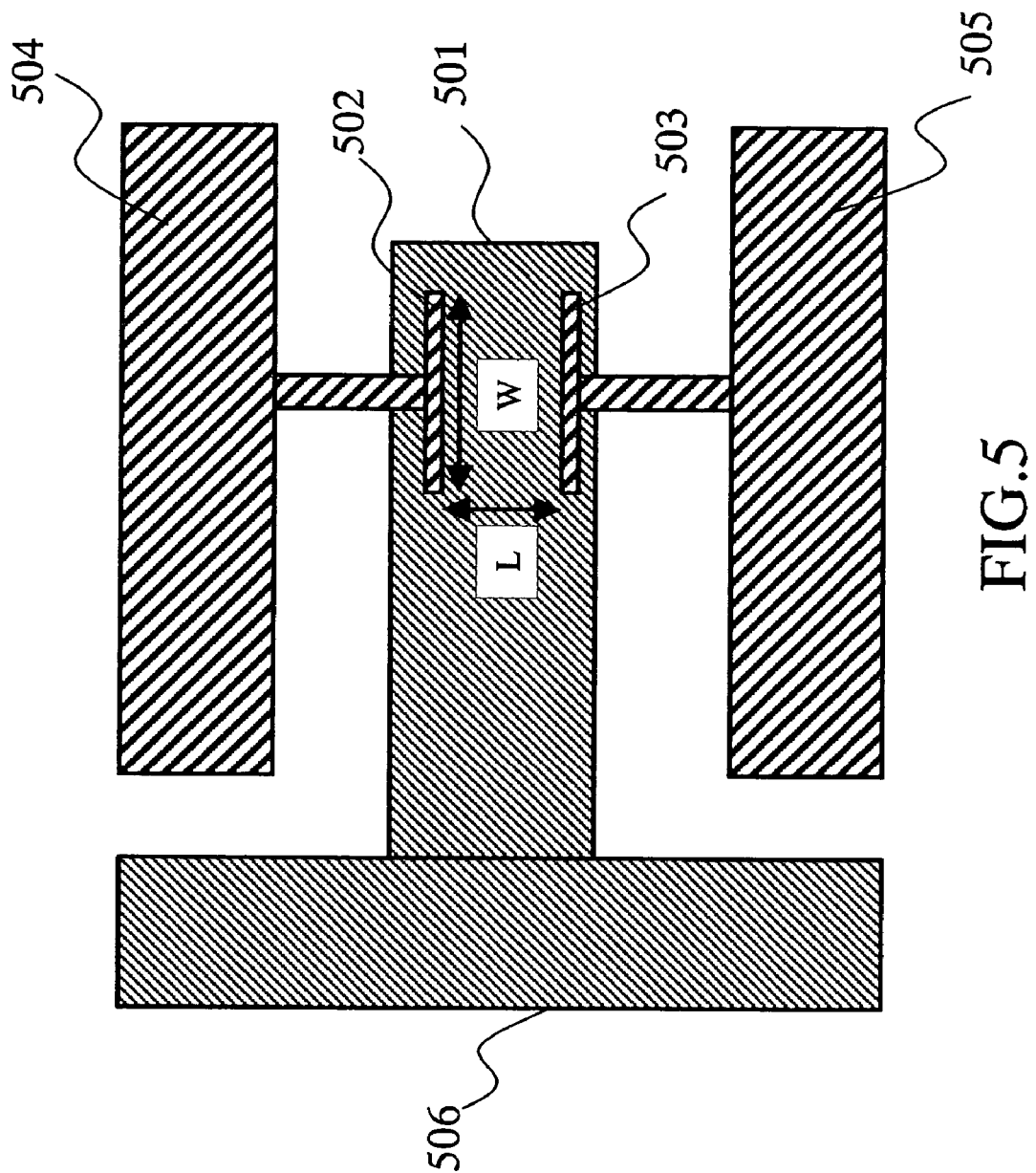
FIG. 5 is a top view showing an organic thin film transistor according to the present invention.
Figure 6:
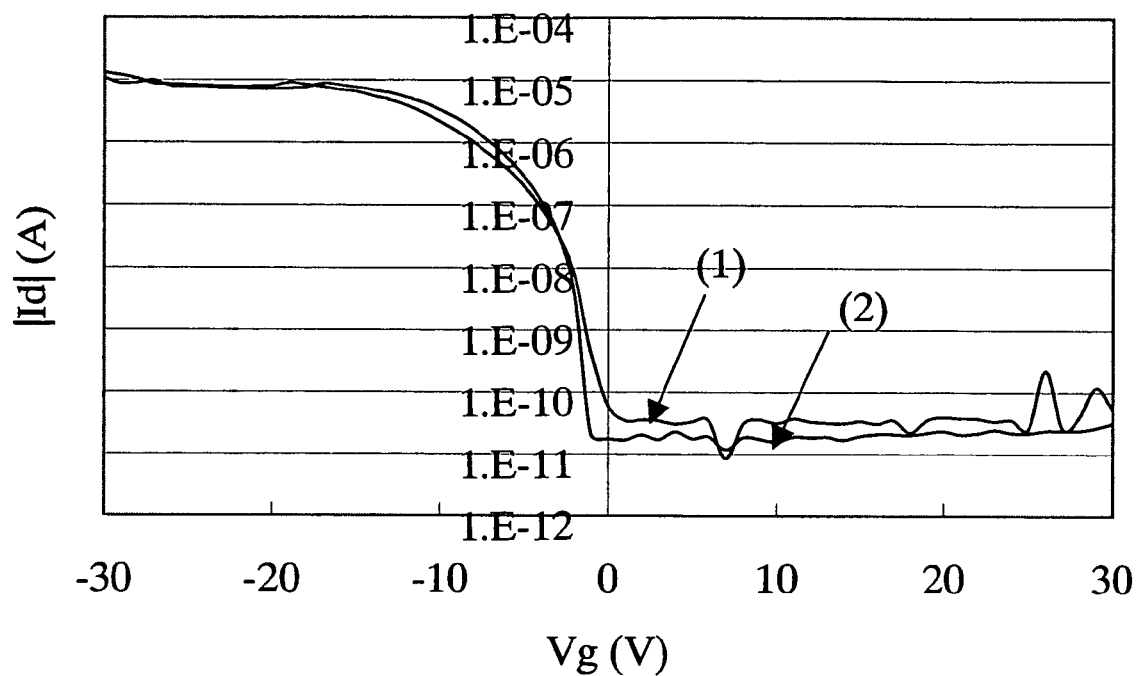
FIG. 6 is a graph showing an experimental result according to the present invention.

In addition, a channel length of the organic TFT corresponds to the total length between the source electrode and the drain electrode (referred to as L in FIG. 5), and the value of L is 100 µm. On the other hand, a channel width of the organic TFT corresponds to the total length of the region in which the source electrode is overlapped with the drain electrode (referred to as W in FIG. 5), and the value of W is 8000 µm. Moreover, pentacene was used as a material for the organic semiconductor. The organic semiconductor was formed to have the film thickness of 50 nm. A vapor deposition method was used as a method for forming a film. The condition after the deposition is as follows:
(1) Electric properties of the organic TFT before being covered with the film-like protector
(2) Electric properties of the organic TFT after being covered with the film-like protector FIG. 6 shows a result of Vg-Id characteristic that the current of the drain electrode and the voltage of the gate electrode are detected when the voltage of −10V is applied as Vd in the condition of (1) and (2). FIG. 6 shows that Vg-Id characteristic does not change before and after the organic semiconductor film is covered with the film-like protector after vapor deposition. Accordingly, it can be understood that the organic TFT characteristic by covering the organic semiconductor film with the film-like protector does not deteriorated.

Embodiment 2

Figure 7:
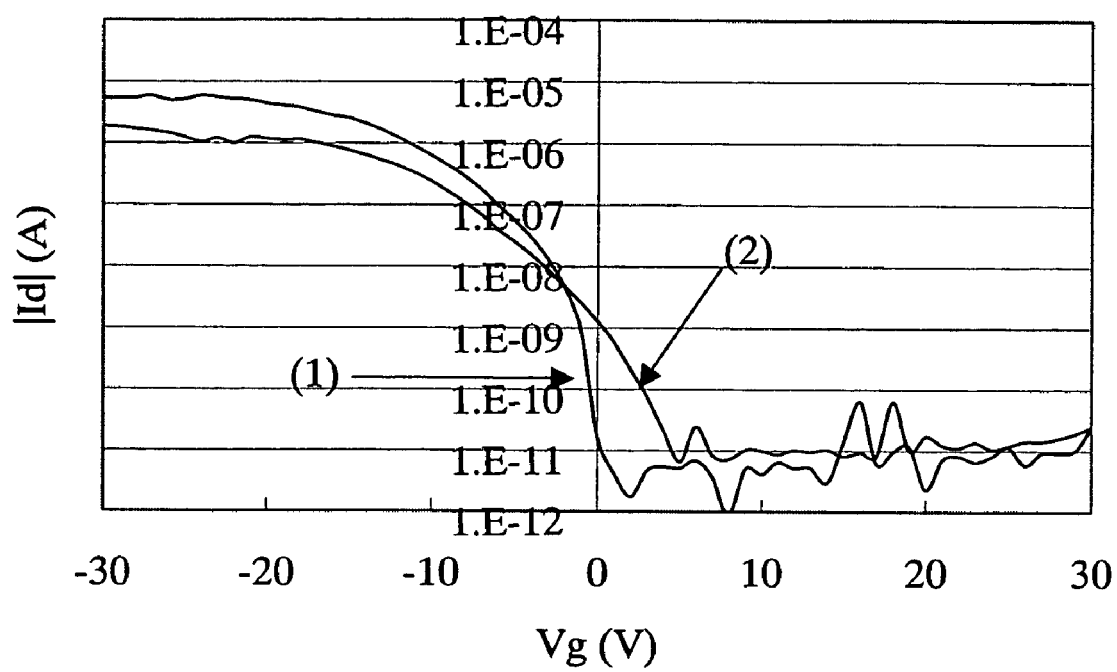
FIG. 7 is a graph showing an experimental result according to the present invention.

In this embodiment, the deterioration in electric properties of an organic TFT, due to time passage, in which an organic semiconductor film is covered with a film-like protector according to the Embodiment Mode 1 was measured. In this embodiment, the film-like protector was formed over the organic semiconductor film by a method for covering the organic semiconductor film with a tape in which an adhesive agent was applied, according to Embodiment Mode 1. Hereinafter, the result is shown. Note that a manufacturing condition of the organic TFT used as a test sample is the same as that in Embodiment 1, besides the condition of covering the organic TFT used as a test sample with the film-like protector. The condition after vapor deposition is as follows:
(1) Electric properties of the organic TFT after the organic semiconductor film is covered with the film-like protector and being left for 168 hours in atmospheric air
(2) Electric properties of the organic TFT after being deposited and being left for 168 hours in atmospheric air FIG. 7 shows a result of Vg-Id characteristic that the current of a drain electrode and the voltage of a gate electrode are detected when voltage of −10V is applied as Vd in the condition of (1) and (2). By comparing the condition of (1) and (2), FIG. 7 shows that ON current of the Vg-Id characteristic is decreased or a threshold value is prevented from shifting toward plus direction by covering the organic semiconductor film over with the film-like protector. Accordingly, it is apparent that an organic semiconductor can be protected from oxidization or decomposition due to exposure to water, light, and oxygen in atmospheric air by covering the organic semiconductor film over with the film-like protector.

Figure 11A:
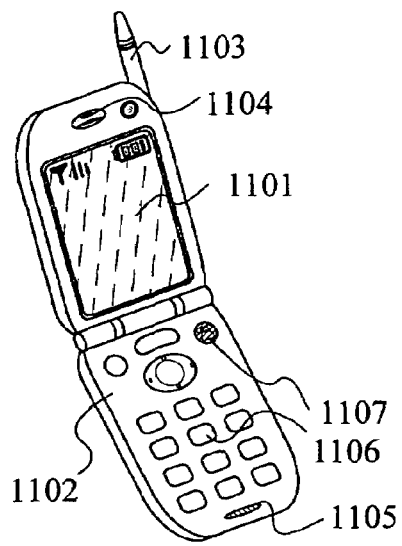
FIGS. 11A to 11C are views of an electric appliance to which the present invention is applied.
Figure 11B:
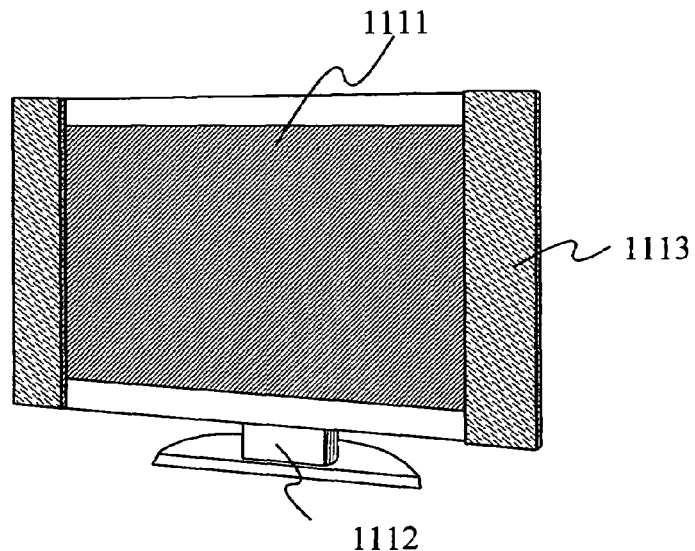
Figure 11C:
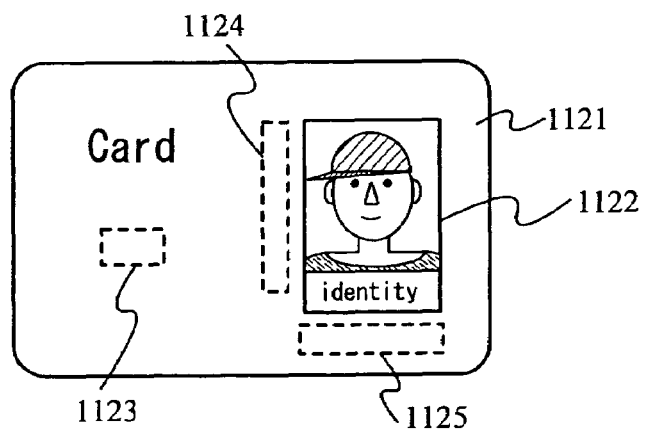

An organic semiconductor device of the present invention can be used as a display device mounted on a cellular phone, a TV receiver, or the like as shown in FIGS. 11A through 11C. Moreover, the display device may be mounted on a card or the like, for example an ID card, which serves as managing personal information.

FIG. 11A shows a view of a cellular phone. A main body 1102 includes a display portion 1101, an audio output portion 1104, an audio input portion 1105, operation keys 1106 and 1107, an antenna 1103, and the like. The cellular phone has high operating characteristic and high reliability. Such a cellular phone can be completed by incorporating the organic semiconductor device of the present invention into the display portion 1101.

FIG. 11B shows a view of a TV receiver manufactured by applying the present invention. The TV receiver includes a display portion 1111, a housing 1112, a speaker 1113, and the like. The TV receiver has high operating characteristic and high reliability. Such a TV receiver can be completed by incorporating the organic semiconductor device according to the present invention in the display portion 1111.

FIG. 11C shows an ID card manufactured by applying the present invention. The ID card includes a support body 1121, a display portion 1122, an integrated circuit chip 1123 incorporated into the support body 1121, and the like. Note that integrated circuits 1124 and 1125 for driving the display portion 1122 are also incorporated in the support body 1121. The ID card has high reliability. Moreover, for example in the display portion 1122, the ID card can display information inputted and outputted in the integrated circuit chip 1123; and thus, what kind of information is inputted and outputted can be confirmed. Such an ID card can be completed by incorporating the organic semiconductor device of the present invention into the display portion 1122.

This application is based on Japanese Patent Application serial no. 2003-434646 field in Japan Patent Office on Dec. 26$^{th}$, 2003, the contents of which are hereby incorporated by reference.

What is claimed is:
1. A semiconductor device comprising:
an organic semiconductor film provided over an insulating film;
a light emitting element provided over the insulating film; and
a film-like support body provided on the organic semiconductor film via an adhesive layer,
wherein the adhesive layer is in contact with the organic semiconductor film and the light emitting element.
2. A semiconductor device comprising:
a substrate having an insulating surface;
a gate electrode provided over the substrate;
a gate insulating film provided over the gate electrode;
a source electrode and a drain electrode provided over the gate insulating film;
an organic semiconductor film provided over the gate insulating film, and the source electrode and the drain electrode;
a light emitting element provided over the substrate, the light emitting element being electrically connected with the source electrode or the drain electrode; and a film-like support body provided on the organic semiconductor film via an adhesive layer,
wherein the adhesive layer is in contact with the organic semiconductor film, the source electrode and the drain electrode, and the light emitting element.

3. A semiconductor device comprising:
a substrate having an insulating surface;
a gate electrode provided over the substrate;
a gate insulating film provided over the gate electrode;
an organic semiconductor film provided over the gate insulating film;
a source electrode and a drain electrode provided to cover a part of the organic semiconductor film;
a light emitting element provided over the substrate, the light emitting element being electrically connected with the source electrode or the drain electrode; and
a film-like support body provided on the organic semiconductor film, and the source electrode and the drain electrode via an adhesive layer,
wherein the adhesive layer is in contact with the organic semiconductor film, the source electrode and the drain electrode, and the light emitting element.

4. A semiconductor device comprising:
a first conductive film provided over an insulating surface;
an insulating film provided over the first conductive film;
a second conductive film provided over the insulating film;
an organic semiconductor film provided over the insulating film and the second conductive film;
a light emitting element provided over the insulating surface, the light emitting element being electrically connected with the second conductive film; and
a film-like support body provided on the organic semiconductor film via an adhesive layer,
wherein the adhesive layer is in contact with the organic semiconductor film, the second conductive film, and the light emitting element.

5. A semiconductor device comprising:
a first conductive film provided over an insulating surface;
an insulating film provided over the first conductive film;
an organic semiconductor film provided over the insulating film;
a second conductive film provided over a part of the organic semiconductor film;
a light emitting element provided over the insulating surface, the light emitting element being electrically connected with the second conductive film; and
a film-like support body provided on the organic semiconductor film and the second conductive film via an adhesive layer r,
wherein the adhesive layer is in contact with the organic semiconductor film, the second conductive film, and the light emitting element.

6. The semiconductor device according to claim 4, wherein the first conductive film serves as a gate electrode.

7. The semiconductor device according to claim 5, wherein the first conductive film serves as a gate electrode.

8. The semiconductor device according to claim 4, wherein the second conductive film serves as a source electrode and a drain electrode.

9. The semiconductor device according to claim 5, wherein the second conductive film serves as a source electrode and a drain electrode.

10. The semiconductor device according to claim 4, wherein the insulating film serves as a gate insulating film.

11. The semiconductor device according to claim 5, wherein the insulating film serves as a gate insulating film.

12. The semiconductor device according to claim 2, wherein the substrate is a borosilicate glass or a quartz glass.

13. The semiconductor device according to claim 3, wherein the substrate is a borosilicate glass or a quartz glass.

14. The semiconductor device according to claim 4, wherein the substrate is a borosilicate glass or a quartz glass.

15. The semiconductor device according to claim 5, wherein the substrate is a borosilicate glass or a quartz glass.

16. The semiconductor device according to claim 1, wherein the support body is polyimide, polyester, polyethylene, polyethylene terephthalate (PET), polyethylene naphtalate (PEN), polyethersulfone (PES), or polycarbonate (PC).

17. The semiconductor device according to claim 2, wherein the support body is polyimide, polyester, polyethylene, polyethylene terephthalate (PET), polyethylene naphtalate (PEN), polyethersulfone (PES), or polycarbonate (PC).

18. The semiconductor device according to claim 3, wherein the support body is polyimide, polyester, polyethylene, polyethylene terephthalate (PET), polyethylene naphtalate (PEN), polyethersulfone (PES), or polycarbonate (PC).

19. The semiconductor device according to claim 4, wherein the support body is polyimide, polyester, polyethylene, polyethylene terephthalate (PET), polyethylene naphtalate (PEN), polyethersulfone (PES), or polycarbonate (PC).

20. The semiconductor device according to claim 5, wherein the support body is polyimide, polyester, polyethylene, polyethylene terephthalate (PET), polyethylene naphtalate (PEN), polyethersulfone (PES), or polycarbonate (PC).

21. The semiconductor device according to claim 1, wherein the adhesive layer includes epoxy-based adhesive agent, a urethane-based adhesive agent, an emulsion-based adhesive agent, a synthetic rubber-based adhesive agent, an elastic adhesive agent, or a denatured acrylate based adhesive agent.

22. The semiconductor device according to claim 2, wherein the adhesive layer includes epoxy-based adhesive agent, a urethane-based adhesive agent, an emulsion-based adhesive agent, a synthetic rubber-based adhesive agent, an elastic adhesive agent, or a denatured acrylate based adhesive agent.

23. The semiconductor device according to claim 3, wherein the adhesive layer includes epoxy-based adhesive agent, a urethane-based adhesive agent, an emulsion-based adhesive agent, a synthetic rubber-based adhesive agent, an elastic adhesive agent, or a denatured acrylate based adhesive agent.

24. The semiconductor device according to claim 4, wherein the adhesive layer includes epoxy-based adhesive agent, a urethane-based adhesive agent, an emulsion-based adhesive agent, a synthetic rubber-based adhesive agent, an elastic adhesive agent, or a denatured acrylate based adhesive agent.

25. The semiconductor device according to claim 5, wherein the adhesive layer includes epoxy-based adhesive agent, a urethane-based adhesive agent, an emulsion-based adhesive agent, a synthetic rubber-based adhesive agent, an elastic adhesive agent, or a denatured acrylate based adhesive agent.

26. The semiconductor device according to claim 1, wherein the support body has a thickness of from 0.05 to 0.5 mm.

27. The semiconductor device according to claim 2, wherein the support body has a thickness of from 0.05 to 0.5 mm.

28. The semiconductor device according to claim 3, wherein the support body has a thickness of from 0.05 to 0.5 mm.

29. The semiconductor device according to claim 4, wherein the support body has a thickness of from 0.05 to 0.5 mm.

30. The semiconductor device according to claim 5, wherein the support body has a thickness of from 0.05 to 0.5 mm.

31. The semiconductor device according to claim 1, wherein said semiconductor device is incorporated in at least one selected from the group consisting of a cellular phone, a TV receiver, and an ID card.

32. The semiconductor device according to claim 2, wherein said semiconductor device is incorporated in at least one selected from the group consisting of a cellular phone, a TV receiver, and an ID card.

33. The semiconductor device according to claim 3, wherein said semiconductor device is incorporated in at least one selected from the group consisting of a cellular phone, a TV receiver, and an ID card.

34. The semiconductor device according to claim 4, wherein said semiconductor device is incorporated in at least one selected from the group consisting of a cellular phone, a TV receiver, and an ID card.

35. The semiconductor device according to claim 5, wherein said semiconductor device is incorporated in at least one selected from the group consisting of a cellular phone, a TV receiver, and an ID card.

36. The semiconductor device according to claim 1, further comprising a film including an inorganic material over the film-like support body.

37. The semiconductor device according to claim 2, further comprising a film including an inorganic material over the film-like support body.

* * * * *